Oct. 1, 1963 E. J. PETERSON 3,105,924

THRESHOLD CIRCUIT

Filed June 4, 1959

INVENTOR.
ELMER J. PETERSON
BY
Carlsen & Hagle
ATTORNEYS

United States Patent Office 3,105,924
Patented Oct. 1, 1963

3,105,924

THRESHOLD CIRCUIT

Elmer J. Peterson, Minneapolis, Minn., assignor to American Monarch Corporation, a corporation of Minnesota Filed June 4, 1959, Ser. No. 818,219
15 Claims. (Cl. 317—148.5)

This invention relates to voltage threshold switching circuits and more specifically to transistorized thyratron action latch circuits.

Voltage threshold switching circuits have found wide acceptance throughout various industries for alarms, indicators, information signal holding devices, and many other uses too numerous to enumerate. This invention provides a voltage threshold circuit adapted to energize a relay coil and for having a temperature compensated threshold voltage.

Accordingly, it is an object of this invention to provide a transistor Zener diode network having a stable conductivity switching voltage threshold.

It is another object of this invention to provide a voltage threshold circuit having a temperature variable voltage threshold.

These and other more detailed and specific objects will be disclosed in the course of the following specification, reference being had to the accompanying drawings, in which—

Figure 1:
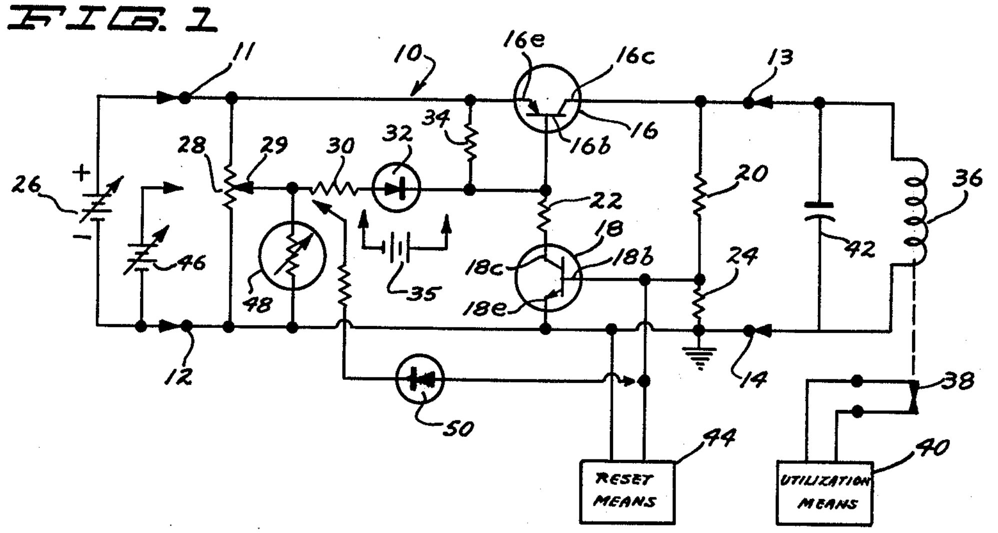
FIG. 1 is a schematic of the preferred embodiment of this invention.

With reference now to the drawing like numbers designate like components and circuit arrangements in the various schematic diagrams. In FIG. 1 there is shown the schematic diagram of a preferred embodiment of a voltage threshold conductivity switching four terminal network 10 having terminals 11, 12, 13 and 14. The network 10 is adapted to switch PNP transistor 16 from a low to a high conductivity state when the voltage from terminal 11 to 12 becomes about 29 or more volts positive and to switch from a high to a low conductivity state when the voltage becomes more negative than about 0.5 volt positive. Alternately the latter switching may be accomplished by removing the voltage source and reapplying a voltage between the terminal less than 29 volts positive. Transistor 16 is preferably a high power dissipation unit and has the usual collector and emitter high current electrodes and a base or control electrode. As the network 10 switches between conductivity states there is provided considerable voltage hysteresis, i.e., there is permitted relatively large voltage variations from the thresholds before the network switches to the other conductivity state—very similar to the circuit behavior of a gas filled electron tube commonly termed a thyratron.

The PNP transistor 16 is interconnected with a complementary type transistor such as NPN transistor 18 to form a latch circuit 16—18 wherein the change of one transistor's conductivity is automatically imposed on the other transistor to provide two distinct conductivity states for this circuit. Positive closed loop feedback is provided between the two transistors by respectively coupling the collector high current electrodes $16^c$ and $18^c$ to the base or control electrodes $18^b$ and $16^b$ of the other transistor through 1000 ohm resistances 20 and 22. It is easily seen that a momentary positive going voltage change on collector $16^c$ makes base $18^b$ more positive than emitter $18^e$ to drive transistor into high conductivity thereby causing the base $16^b$ to become more negative with respect to emitter $16^e$ voltage and providing a yet more positive voltage on the collector $16^c$. With relatively high gain transistors the just described cumulative switching action is very responsive to slight voltage changes on the base electrodes to switch both transistors to the current saturation (high conductivity) operating regions. The reverse switching action, i.e., from high to low conductivity, is accomplished by momentarily reverse biasing to current cutoff the emitter-base junction of either transistor. A 100 ohm resistance 24 between base $18^b$ and common terminals 12—14 is added to provide circuit stability during low conductivity making the transistor 18 less sensitive to voltage variations.

The preferred embodiment was first used to detect and supply a signal indicative of the voltage across terminals 11—12 provided by a variable battery 26, such as a battery being electrically charged. The input voltage sensing portion of network 10 includes a 500 ohm resistive variable voltage divider or potentiometer 28 connected between terminals 11 and 12 and having a movable intermediate voltage take off point or tap 29. It able intermediate voltage take-off point or tap 29. It is seen that divider 28 is also connected between the emitter high current electrodes $16^e$ and $18^e$. Variable intermediate voltage take off point 29 is coupled through resistance 30 to the anode electrode of a Zener diode 32. The diode 32 is a usual Zener diode which has the forward (anode to cathode) unidirection current conducting characteristics of a semi-conductor diode while in the reverse direction (cathode to anode) it is effective to block currents to a predetermined voltage, for example 5.6 volts. At greater reverse voltages the reverse impedance changes from a very high to an extremely low value, i.e., the diode has reverse voltage breakdown characteristics.

The diode 32 cathode is coupled to the base $16^b$ and to the terminal 11 through one hundred ohm latch circuit low conductivity state stabilizing resistance 34. To switch transistor 16 to a high conductivity state base drive current must flow through the transistor body portion including the emitter and base electrodes and thence either through transistor 18 or through diode 32 in the reverse direction. In this embodiment diode 32 reverse breakdown voltage is used to provide a voltage threshold across terminals 11—12 for switching network 10 to a high conductive state. Prior to battery 26 voltage reaching the positive voltage threshold of terminals 11—12 the voltage drop from terminal 11 to tap 29 of divider 28 appears across diode 32 in the reverse direction with the diode in base drive current blocking relation to transistor 16. As the voltage threshold is reached the voltage 11—29 equals the diode 32 reverse breakdown permitting reverse current to flow therethrough and thus permitting base drive current to flow through the emitter-base portion of the transistor 16. This base drive current through base electrode $16^b$ is operative to make transistor 16 slightly conductive thereby making its collector voltage more positive causing the aforedescribed cumulative switching action of latch circuit 16—18. Once the switching action is completed the transistor 16 base current is provided through latching transistor 18 and the diode 32 may actually be forward voltage biased to conduct current in the forward direction.

Diode 32 behaves in the reverse direction very similarly to a small voltage reference battery having an output voltage equal to the diode reverse breakdown voltage. Accordingly a small battery 35 may be substituted for the diode 32 as indicated by the arrows in FIG. 1 with its positive voltage output being applied to base $16^b$. A nickel-cadmium cell has been found suitable for this purpose.

As the network 10 switches from low (current cutoff) to high (current saturation) conductivity, the terminal 13—14 voltage changes from substantially zero to approximately the terminal 11—12 voltage threshold magnitude of 29 volts. With such a substantial voltage change and with PNP transistor 16 being a high current conducting transistor a relay coil 36 may be selectively energized by the network 10. Relay coil 36 is operatively connected to normally closed relay contacts 38 forming a part of a control circuit (not shown) for utilization means 40. For example battery 26 may be a battery being electrically charged by the means 40 and when the battery is fully charged as indicated by its voltage, network 10 switch conductivity causing contacts 38 to open providing an electrical indication to means 40 to stop charging the battery.

As previously stated latch circuit 16—18 is extremely responsive to small momentary voltage changes on either base electrode. With relay coil 36 having a high inductance therein any small and momentary change in collector leakage current through transistor 16 such as caused by connecting battery 26 to terminals 11—12 results in an inductive "kick" of sufficient amplitude to trigger transistor 18 into high conductivity. Latch circuit 16—18 then energizes coil 36 giving a false indication of the battery 26 voltage. Placing twenty-five microfarad capacitor 42 across coil 36 provided sufficient voltage inertia to the terminal 13 and thus to base $18^b$ to eliminate undesired latch circuit switching caused by fluctuating leakage currents.

In operating the first embodiment of this invention the network 10 was conveniently reset by disconnecting the battery 26 from terminals 11—12 and reconnecting it thereto at a voltage less positive than the threshold voltage magnitude. Alternately a reset means 44 may be installed with the circuit between a base electrode $18^b$ and an emitter electrode $18^e$. Reset means 44 which may consist of a battery and a momentary manually actuated switch (not shown) applies a voltage reverse biasing the emitter-base junction to current cut-off for a period of time sufficient to sweep the minority carriers from the base regions of both transistors. In driving transistor 18 into the current cutoff region transistor 16 is also driven into current cutoff, i.e., low conductivity. It is understood that reset means 44 may be attached to base $16^b$ with equal effectiveness.

Network 10 may be also connected to switch conductivity based on the difference of two battery or signal voltages. Voltage divider 28 is eliminated and the voltage takeoff point 29 is connected to a second variable battery 46. As aforestated it is the voltage between terminal 11 and point 29 that is operative to switch conductivity of the network, thus as battery 26 becomes more positive with respect to battery 46 the Zener voltage of diode 32 is exceeded to cause the network 10 to become highly conductive. The circuit is reset to low conductivity by causing battery 26 voltage to equal or become more negative than the battery 46 voltage. Therefore the conductivity state of network 10 also can be used to compare the voltages from two independent voltage sources.

In the first usage of the network 10 in charging storage type batteries it was necessary to vary the battery "full charge" voltage with changes in ambient temperatures. The warmer the ambient temperature the lower the desired "full charge" battery voltage. A thermistor 48 is added between voltage takeoff point 29 and terminal 12 to provide variation of the conductivity switching voltage threshold in inverse proportion to the temperature change. As the ambient temperature increases the resistance of thermistor 48 decreases which decreases the total resistance between point 29 and terminal 12. As a result the voltage increase between terminal 11 and point 29 is more for a given voltage increase across terminals 11—12 than when thermistor 48 has a higher resistance. Therefore the voltage from terminal 11 to 12 must become somewhat less positive than the mentioned design center threshold of 29 volts. As the temperature decreases the reverse is true.

It is appreciated that by placing a thermistor between terminal 11 and voltage takeoff point 29 the switching threshold voltage will vary proportional to the ambient temperature.

It is understood that transistor 16 may be of the NPN type and 18 may be of the PNP type when the Zener diode 32 is poled in the reverse direction and a negative voltage with respect to terminal 12 is applied to terminal 11.

A modification of the FIG. 1 circuit providing equivalent operation is had by coupling voltage take-off point 29 to the base electrode $18^b$ through Zener diode 50 instead of base $16^b$ through diode 32 and connecting thermistor 48 between terminal 11 and point 29. In this modification the voltage across the emitter-base junction of transistor 18 is made positive in the direction of the emitter arrow to provide base drive current for switching transistor to a high conductivity state. The positive switching voltage is from point 29 to terminal 12 which provides a reverse current through diode 50 in the same manner as described for diode 32 switching the latch circuit 16—18 to a high conductivity state.

Figure 2:
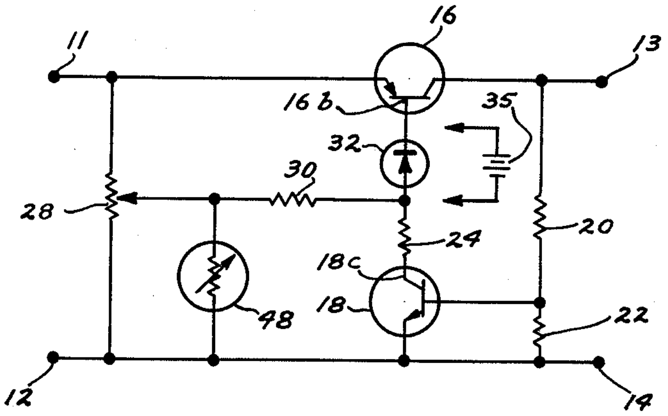
FIG. 2 is a schematic of a first alternate embodiment of this invention.

The FIG. 2 embodiment of the present invention differs from the FIG. 1 circuit in that the Zener diode 32 is interposed in current opposing relation between a base electrode $16^b$ and the collector electrode $18^c$ and resistance 34 is eliminated. The circuits operate identically except that in FIG. 2 all of the transistor 16 base current flows through the diode 32 while in the preferred FIG. 1 embodiment the reverse current through the diode is only momentary during the low to high conductivity switching action.

Figure 3:
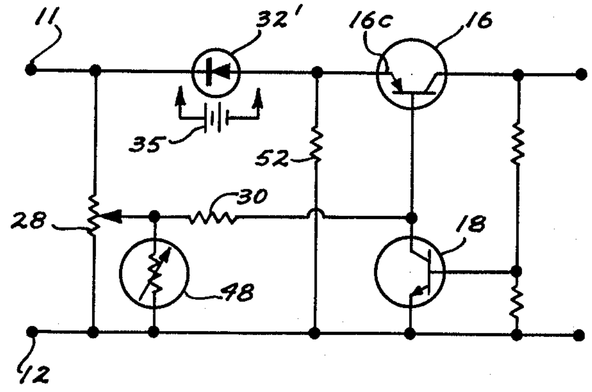
FIG. 3 is a schematic of another embodiment of this invention.

In the FIG. 3 embodiment of this invention a high current Zener diode 32′ is inserted between terminal 11 and emitter $16^e$ in current opposing relation and with resistance 52 providing a current return path to terminal 12. The Zener blocks all current until the reverse breakdown voltage is reached at which time the low to high conductivity switching occurs as previously described. Of the three illustrated embodiments this latter one has the greatest drift of conductivity switching voltage threshold caused by the high current through the diode 32′ heating the semi-conductive material therein. In this embodiment the diode 32′ is in series connection with the transistor 16 high current electrodes, the emitter and collector, rather than in series circuit with the low current base or control electrode.

It is understood that suitable modifications may be made in the structure as disclosed, provided such modifications come within the spirit and scope of the appended claims.

Having now therefore fully described my invention, what I claim to be new and desire to protect by Letters Patent is:

1. A voltage threshold switching circuit comprising two complementary transistors each having a collector, emitter and base electrodes, a unidirectional current conducting device exhibiting reverse voltage breakdown characteristics connected to the base electrode of one transistor and being electrically associated with the collector of the other transistor and polarized to oppose current flow in the forward direction through the other transistor, the one transistor collector being electrically associated with the base electrode of the other transistor, and voltage input means connected to the emitters of both transistors and having an intermediate voltage input point electrically associated with the collector of the other transistor.

2. A temperature variable voltage threshold switching circuit comprising a pair of complementary transistors each having a base collector and an emitter electrode, a pair of voltage input terminals for connection to a voltage source and being connected to the emitters of said respective transistors such that all of the power for said circuit is provided through said terminals, a resistance connected between the base and emitter of the respective transistors, a voltage divider connected across said terminals and having an intermediate voltage takeoff point, a thermistor connected between said voltage point and one of the terminals, a resistor connected between the collector of each transistor and the base of the other transistor a unidirectional current conducting device exhibiting reverse voltage breakdown characteristics connected between said point and a base electrode of one of said transistors such that the base drive current thereof is provided through said device initially only when the device is conducting current in the reverse direction and thereafter through the other one of the transistors.

3. A threshold switching circuit comprising two complementary transistors each having collector, emitter and base electrodes, the collectors being respectively electrically connected to the other transistor base electrodes, a voltage divider connected between the transistors respective emitter electrodes and having an intermediate voltage takeoff point, a unidirectional current conducting device exhibiting reverse voltage breakdown characteristics connected between the intermediate takeoff point and one of the transistor base electrodes in base drive current blocking relation whereby when the voltage between said emitters exceeds the reverse voltage breakdown magnitude and polarity multiplied by the ratio of the voltages between emitters and between the emitter of said one transistor and the voltage point base drive current flows momentarily through the diode, and a thermistor connected between said voltage point and the emitter of the other transistor.

4. A voltage threshold switching circuit comprising two complementary transistors each having collector, emitter and base electrodes, the collectors being respectively resistively coupled to the other transistor base electrodes, the base and emitter electrodes of each transistor being respectively resistively coupled together, a voltage divider connected between the transistors emitter electrodes and having an intermediate voltage take off point, a thermistor connected between said point and the emitter of a first one of said transistors, a relay coil connected between the first transistor emitter and the second transistor collector, variable battery means connected across said divider, and a unidirectional current conducting device exhibiting reverse voltage breakdown characteristics resistively coupled to said voltage point and connected to the base electrode of the second transistor in drive current blocking relation.

5. A threshold circuit comprising; first and second transistor devices each having collector base and emitter electrodes and being of opposite conductivity type; circuit means interconnecting the collector of each of said transistor devices to the base electrodes of the other of each of said transistor devices; a pair of terminals adapted for connection to a source of variable voltage; circuit means connected intermediate of said terminals for providing an intermediate terminal; circuit means connecting the emitter and collector electrodes of one of said transistor devices intermediate said terminals; further circuit means connecting the emitter of the other of said transistor devices to one of said terminals; and further circuit means, including voltage reference means, connecting the emitter and base electrodes of the first of said transistor devices intermediate one of said terminals and said intermediate terminal whereby said transistor devices will be non-conductive until the voltage appearing between said terminal and said intermediate terminal exceeds that of said reference device.

6. The apparatus of claim 5 in which said voltage reference device is an asymmetrical current conducting device exhibiting reverse voltage breakdown characteristics.

7. A voltage threshold circuit, comprising, input, output and common terminals; a current controlling device having first, second and third electrodes, means connecting said first and second electrodes intermediate said output and said input terminals; voltage dividing means interconnecting said input and said common terminals, said dividing means including an intermediate terminal; circuit means, including an asymmetrical current conducting device exhibiting reverse voltage breakdown characteristics, interconnecting said third electrode and the intermediate terminal on said divider means, said asymmetrical current conducting device being connected in such a manner as to oppose the flow of current therethrough; a further current controlling device including first, second and third electrodes; circuit means connecting said third electrode to said output terminal; circuit means connecting said second electrode to the third electrode of the other of said current controlling devices; and circuit means connecting said first electrode to said common terminal.

8. A voltage threshold switching circuit comprising two complementary transistors each having collector, emitter and base electrodes, a unidirectional current conducting device exhibiting reverse voltage breakdown characteristics connected to the base electrode of one transistor in base drive current blocking relation, a resistance connected to said device at its end opposite to the base electrode and to the other transistor collector elecrode, a thermistor connected between the other transistor emitter and the resistance connected end of said device, a resistor interconnecting the one transistor collector to the base electrode of the other transistor, and voltage input means connected to the emitters of both transistors and having an intermediate voltage point connected to the device resistance connected end.

9. A voltage threshold switching circuit comprising two complementary transistors each having a collector and emitter high current electrodes and a base electrode, a resistive element being connected between the emitters, a first impedance coupling the collector of one transistor to the second transistor base, a second impedance connecting to its emitter, a diode exhibiting reverse voltage breakdown characteristics and having one end connected to the emitter of the one transistor in base drive current blocking relation, and a voltage divider connected between the diode other end and the second transistor emitter with a divider intermediate voltage take off point being connected to the one transistor base and the second transistor collector.

10. A voltage threshold circuit, comprising; input, output and common terminals; a current controlling device of a first conductivity type having first, second and third electrodes, means connecting said first and second electrodes intermediate said output and input terminal; voltage dividing means interconnecting said input and output terminals, said dividing means including an intermediate terminal; circuit means, including an asymmetrical current conducting device exhibiting reverse voltage breakdown characteristics, interconnecting said third electrode and the intermediate terminal on said divider means, said asymmetrical current conducting device being connected in such a manner as to oppose the flow of current therethrough; a further current controlling device of a second conductivity type including first, second and third electrodes; circuit means connecting said third electrode to said output terminal; circuit means connecting said second electrode to the third electrode of the other of said current controlling devices; and circuit means connecting said first electrode to said common terminal whereby said further current controlling device is operative to maintain said first named current controlling device in a conductive state in response to the output thereof.

11. The apparatus of claim 9 in which a thermistor is electrically connected to at least a portion of the voltage divider.

12. A temperature variable voltage threshold switching circuit comprising a pair of complementary transistors each having a base, collector and an emitter electrode, a pair of voltage input terminals for connection to a voltage source and being connected to the emitters of said respective transistors such that all of the power for said circuit is provided through said terminals, a resistance connected between the base and emitter of the respective transistors, a voltage divider connected across said terminals and having an intermediate voltage takeoff point, a thermistor connected between said voltage point and one of the terminals, a resistor connected between the collector of each transistor and the base of the other transistor, and circuit means including a unidirectional current conducting device exhibiting reverse voltage breakdown characteristics connecting the emitter and base electrodes of one of said transistors across at least a portion of said voltage divider whereby the base drive current thereof is operative to provide an output therefrom only when the voltage across said portion of said voltage divider exceeds a predetermined value.

13. The apparatus of claim 5 in which the circuit means connected intermediate the pair of terminals includes a temperature responsive variable impedance means.

14. The apparatus of claim 6 in which the circuit means connected intermediate the pair of terminals includes a thermistor.

15. In apparatus of the class above described, switching means, comprising; a pair of current controlling devices each having input and output terminals, said current controlling devices being of opposite conductivity type; circuit means interconnecting the output terminals of one of said devices and the input terminals of the other of said devices; circuit means connecting the output terminals of the other of said devices to the input terminals of said one of said devices; a source of direct current energy; voltage divider means connected across said source of energy, said voltage divider means including at least one intermediate terminal therefor; circuit means connecting the output terminals of said one of said current controlling devices across said source of energy and further circuit means including an asymmetrical current conducting device exhibiting variable reverse voltage breakdown characteristics connecting the input terminals of said one of said current controlling devices across a portion of said voltage divider means including said intermediate terminal, whereby one of said current controlling devices is conductive only when the voltage across the portion of said voltage divider means exceeds a predetermined value and the other of said current controlling devices is conductive in accordance with said first named current controlling device and both of said current controlling devices remain conductive.

References Cited in the file of this patent

UNITED STATES PATENTS

| | | |
|---|---|---|
| 2,751,550 | Chase | June 19, 1956 |
| 2,828,450 | Pinckaers | Mar. 25, 1958 |
| 2,892,143 | Sommer | June 23, 1959 |
| 2,896,151 | Zelinka | July 21, 1959 |
| 2,913,599 | Benton | Nov. 17, 1959 |

FOREIGN PATENTS

| | | |
|---|---|---|
| 567,178 | Belgium | Oct. 28, 1958 |

OTHER REFERENCES

Holec: "Ideas for Design," Electronic Design, May 27, 1959.